US008810301B1

(12) United States Patent
Evans et al.

(10) Patent No.: US 8,810,301 B1
(45) Date of Patent: Aug. 19, 2014

(54) SYSTEM AND METHOD FOR LEVEL SHIFTING SIGNALS WITH ADJUSTABLY CONTROLLED FREQUENCY RESPONSE

(75) Inventors: William Pierce Evans, Catonsville, MD (US); Michael Casas, Pasadena, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 182 days.

(21) Appl. No.: 13/530,597

(22) Filed: Jun. 22, 2012

(51) Int. Cl.
*H03L 5/00* (2006.01)

(52) U.S. Cl.
USPC ........................................ 327/333; 327/517

(58) Field of Classification Search
CPC ................ H03K 3/356113; H03K 19/018521; H03K 19/00315; H03K 17/102; H03K 3/012; H03K 17/16; G01R 31/316; G01S 15/107; G05B 11/00; G05D 23/2453
USPC ........... 327/61, 62, 68, 91–95, 333, 336, 337, 327/308, 551–554, 517
See application file for complete search history.

(56) References Cited

U.S. PATENT DOCUMENTS

| 7,948,270 | B1 | 5/2011 | Evans et al. | |
| 2011/0279170 | A1* | 11/2011 | Cormier, Jr. | 327/517 |
| 2013/0329853 | A1* | 12/2013 | Coln et al. | 378/19 |

* cited by examiner

*Primary Examiner* — Lincoln Donovan
*Assistant Examiner* — Diana J Cheng
(74) *Attorney, Agent, or Firm* — Rosenberg, Klein & Lee

(57) ABSTRACT

A system and method are provided for level shifting signals generated by an electronic circuit with selectively controlled frequency response. A first circuit portion defines a primary path for a signal within an upper region of a predefined signal frequency range, and includes a first capacitor unit establishing a voltage level shift for a signal passing therethrough. A second circuit portion selectively defines a secondary path bypassing the primary path for a signal within a lower region of the predefined signal frequency range, and includes a switched capacitive section disposed in parallel across the first capacitor unit to establish a voltage level shift for the signal passing therethrough. A second capacitor unit charges substantially to a predetermined shift voltage in a charging phase and couples to the first capacitor unit during a transfer phase. An attenuation adjust unit adjustably augments a parasitic capacitance of the first or second circuit portion.

25 Claims, 5 Drawing Sheets

SYSTEM AND METHOD FOR LEVEL SHIFTING SIGNALS WITH ADJUSTABLY CONTROLLED FREQUENCY RESPONSE

BACKGROUND OF THE INVENTION

The present invention is generally directed to a system and method for level shifting signals within a range of frequencies. More specifically, the present invention is directed to a system and method for voltage level shifting signals in adjustably controlled manner to maintain a desired frequency response across their full range. The subject system and method thereby provide for such voltage level shifting of signals with the desired frequency response, while preserving low power consumption and low signal distortion.

Ongoing advances in the electronics industry continue to yield smaller device geometries and higher transfer speeds between circuit elements. Among other things, this has led to heightened sensitivities in transistor devices, whose breakdown voltages continue to creep ever lower, affording very little margin in the power supply voltage levels typically used for high speed integrated circuits. It is not uncommon for such high speed applications (for instance, in the range of Giga-samples/sec) to employ power supply voltages of about 1V, or even less. Since threshold voltages of transistor devices remain relatively high, however, a significant portion of the supply voltage magnitude may be consumed in actuating transistor devices. This may be so, even when a data signal is simply passed through a voltage follower or other such buffer structure. Unless recovered by suitable voltage level shifting, the downshift in voltage magnitude jeopardizes signal integrity.

While various voltage level shift circuits are known and widely used in the art, many either consume too much power or introduce too much distortion for at least some part of the signal frequency range at hand to be of optimal use. In certain high speed applications, for example, consistent voltage level shifting is needed across the full frequency range of input signals—from a substantially direct current (DC) level up through at least the applicable Nyquist frequency (½ the sampling rate to be applied) in order to suit subsequent sampling and processing operations. Yet, known voltage level shift circuits typically only provide level shifting for signals in just a part of the signal frequency range, or otherwise fail to provide a response that remains sufficiently consistent (or 'flat') across the full range of signal frequencies. At best, the frequency response of such known circuits may show acceptable response in one frequency region, with the response in another region being plagued by excessive attenuation.

A notable example is found in high speed sample and hold circuits, which often require substantial level shifting to recover for voltage loss in the sampled and held portion of an input signal. These circuits employ various open loop voltage buffer architectures to attain the required level of settling accuracy in a short period of time. Perhaps the most common architecture for high speed applications, especially in applications where the speed required is greater than the buffer's operational amplifier can provide, is one which employs a voltage follower topology. Since signals passing through a voltage follower undergo an attenuating voltage level shift—upward in gate-source voltage Vgs for a PMOS follower, or downward in gate-source voltage Vgs for an NMOS follower—the emerging signals must be restored by level shifting to preserve sufficient supply voltage margin. In the case of a differential signal, such level shifting would be effected in the common mode circuitry for each complementary component of the signal.

Most of the active high speed level shift approaches known require considerable power to maintain sufficiently high speed and linearity. As supply voltages drop below one Volt (such as in certain deep submicron processes, on the order of 28 nm for instance), these active level shift approaches become impractical. Consequently, many sample and hold architectures with level shift which had proven effective in the past with higher supply voltages now prove ineffective.

There is therefore a need for a system and method which provide ample level shifting across the full expected range of signal frequencies with low power consumption. There is a need for a system and method which provide such level shifting while preserving low distortion and maintaining a desired frequency response across the given signal frequency range. There is a need for such system and method which when implemented in a sample and hold application, minimize distortion for signals ranging substantially from DC and up to and beyond the expected Nyquist frequency (Fs/2) for subsequent sampling and processing measures.

SUMMARY OF THE INVENTION

It is an object of the present invention to provide a system and method for level shifting signals within a range of frequencies.

It is another object of the present invention to provide a system and method for voltage level shifting signals in adjustably controlled manner to maintain a desired frequency response across their full range.

It is a further object of the present invention to provide a system and method for such voltage level shifting of signals, while preserving low power consumption and low signal distortion.

These and other objects are attained in a system formed in accordance with an exemplary embodiment of the present invention for level shifting signals provided by an electronic circuit with selectively controlled frequency response. The system comprises a first circuit portion defining a primary path for an intermediate signal generated by the electronic circuit within an upper region of a predefined signal frequency range. The first circuit portion includes a first capacitor unit establishing a voltage level shift for the intermediate signal when passed through the primary path. The system also includes a second circuit portion selectively defining a secondary path bypassing the primary path for an intermediate signal generated by the electronic circuit within a lower region of the predefined signal frequency range. The second circuit portion establishes a voltage level shift for the intermediate signal when passed through the secondary path, and includes a switched capacitive section disposed in parallel across the first capacitor unit. The switched capacitive section selectively actuates in mutually exclusive charging and transfer phases, whereby a second capacitor unit is charged substantially to a predetermined shift voltage in the charging phase and coupled to the first capacitor unit during the transfer phase. At least one attenuation adjust unit is coupled to one of the first or second circuit portions. The attenuation adjust unit is selectively configured in capacitance for adjustably augmenting a parasitic capacitance of the first or second circuit portion.

In certain exemplary embodiments of the present invention, a sample and hold system with level shifting having selectively controlled frequency response is provided. The sample and hold system comprises a hold capacitor periodically switched according to a bootstrap signal to hold a sampled part of an input signal, the bootstrap signal periodically aligning in amplitude with the input signal. The sample and hold system further comprises an output buffer, first and second circuit portions, and at least one attenuation adjust unit. The first circuit portion is coupled to define a high frequency path between the hold capacitor and output buffer for an intermediate signal generated upon charging of the hold capacitor within an upper region of a predefined signal frequency range. The first circuit portion includes a first capacitor unit establishing a voltage level shift for the intermediate signal when passed through the primary path. The second circuit portion selectively defines a low frequency path bypassing the primary path for an intermediate signal generated upon charging of the hold capacitor to be within a lower region of the predefined signal frequency range. The second circuit portion establishes voltage level shift for the intermediate signal when passed through the secondary path, and includes a switched capacitive section disposed in parallel across the first capacitor unit. The switched capacitive section selectively actuates in mutually exclusive charging and transfer phases, whereby a second capacitor unit is charged substantially to a predetermined shift voltage in the charging phase and coupled to the first capacitor unit during the transfer phase. The attenuation adjust unit is coupled to one of the first or second circuit portions, and is selectively configured in capacitance for adjustably augmenting a parasitic capacitance of the first or second circuit portion.

A method formed in accordance with an exemplary embodiment of the present invention carries out level shifting of signals provided by an electronic circuit with selectively controlled frequency response. The method comprises establishing a first circuit portion to define a high frequency path for an intermediate signal generated by the electronic circuit within an upper region of a predefined signal frequency range. A first capacitor unit in the first circuit portion is charged to a apply a voltage level shift to the intermediate signal when passed through the high frequency path. A second circuit portion is established to define a low frequency path bypassing the primary path for an intermediate signal generated by the electronic circuit within a lower region of the predefined signal frequency range. The second circuit portion is actuated to apply a voltage level shift to the intermediate signal when passed through the low frequency path. A switched capacitive section in the second circuit portion selectively actuates in mutually exclusive charging and transfer phases, whereby a second capacitor unit in the switched capacitive section is charged substantially to a predetermined shift voltage in the charging phase, and coupling to the first capacitor unit during the transfer phase. At least one attenuation adjust unit is coupled to one of the first or second circuit portions and selectively configured in capacitance to adjustably augment a parasitic capacitance of the first or second circuit portion.

DESCRIPTION OF THE PREFERRED EMBODIMENTS

Generally, a system and method formed in accordance with certain embodiments of the present invention provide for voltage level shifting of signals while maintaining a desired response across their full range of expected signal frequencies. The system and method provide for voltage level shifted passage of signals having frequencies from a certain desired level (such as an applicable Nyquist frequency) substantially down to a DC (direct current) level, so as to suit subsequent operations such as analog-to-digital (A-D) conversion, high bandwidth IQ (in-phase and quadrature) processing, and the like. Toward that end, the system and method as implemented in various applications make use of first and second circuit portions to respectively define high and low frequency signal paths for voltage level shifted passage of signals within upper and lower regions of the given signal frequency range. The system and method include measures for adjustably controlling attenuation in one or both of the high and low frequency signal paths due to parasitic capacitance and other such stray factors.

Preferably, the attenuation control measures are provided in digitally programmable form, so that they may be readily adjusted as needed even after physical system implementation on an integrated circuit chip or the like. In certain exemplary embodiments, the control measures include an attenuation adjust unit coupled to at least one—and preferably each—of the first and second circuit portions. The attenuation adjust unit is programmably configurable to selectively augment the intrinsic parasitic capacitance of a circuit portion, if it would otherwise cause aberrant gain in one of the high and low frequency signal paths in relation to the other. The attenuation adjust unit may be selectively configured in this manner to adjust the resulting gain to optimum/desired levels.

Figure 1:
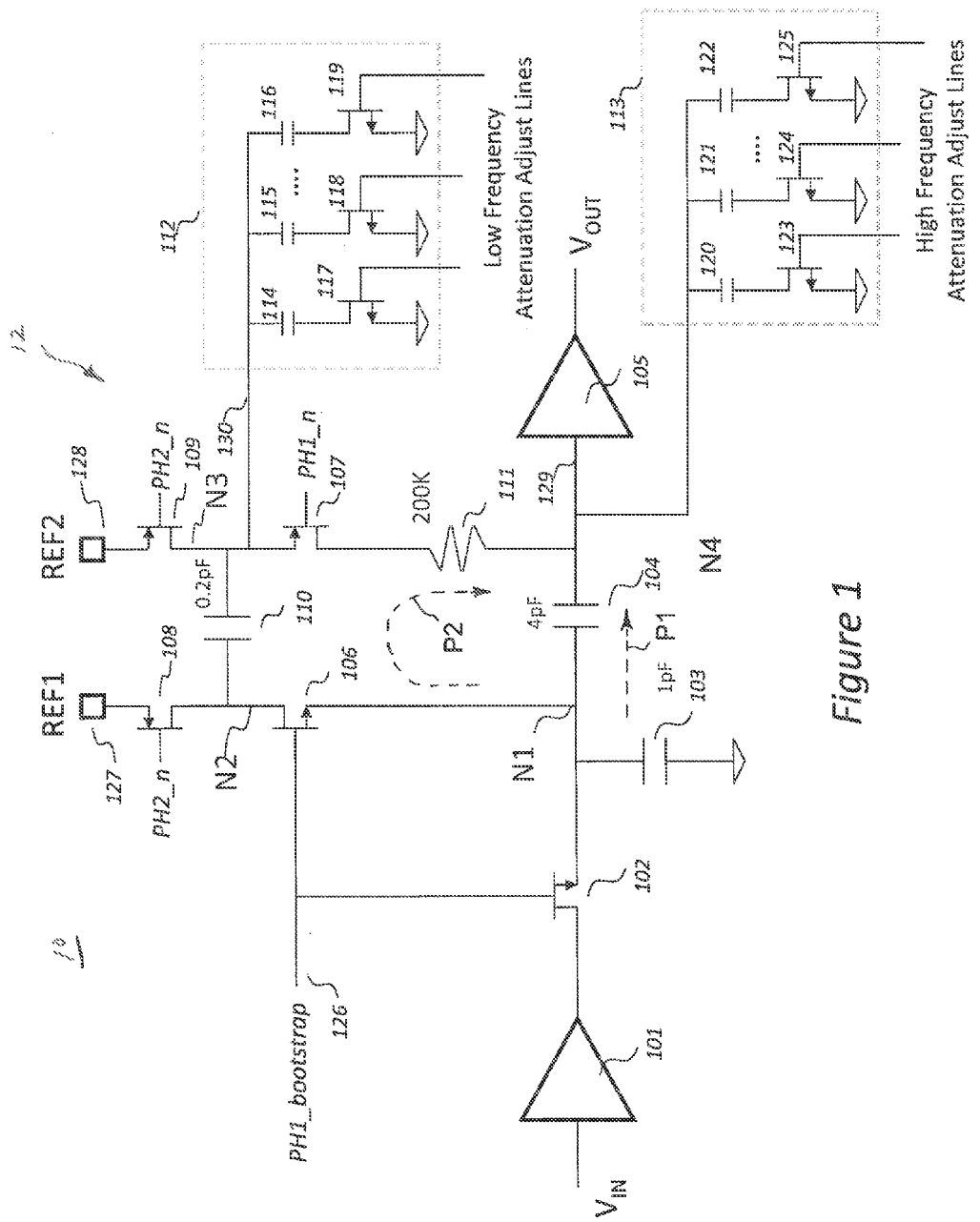
FIG. 1 is a schematic diagram of a system formed in accordance with one exemplary embodiment of the present invention.

Referring now to FIG. 1, a system 10 formed in accordance with one exemplary embodiment of the present invention is illustrated. In this particular embodiment, system 10 is illustratively implemented for a sample and hold circuit application of the type typically used, for instance, in connection with A-D conversion. One skilled in the art will readily recognize that the subject system and method is not necessarily limited to the illustrated application, and that it may be implemented with numerous variations in circuit topology, circuit components, device types, unit configurations, and the like even within a sample and hold application of the type shown.

System 10 receives at its input buffer 101 an input signal $V_{IN}$ having a predetermined range of signal frequencies which may in certain cases extend all the way down to DC. Many high speed applications utilize differential signaling, where data is passed through a complementary pair of signals. In the illustrated example, the input signal $V_{IN}$ actually represents one component (either the plus or minus component) of a differential signal, with system 10 being shown for just this one signal component. Preferably, system 10 would be similarly implemented for the other complementary signal component not shown, so as to effect a common mode voltage level shift for each signal component of the differential signal, without directly altering the data 'riding' thereon.

System 10 includes a hold capacitor 103 coupled to an output terminal of the input buffer 101 by a sampling switch 102. System 10 further includes an output buffer 105 and a level shift segment 12 disposed between the hold capacitor 103 and input terminal of the output buffer 105 (via a net 129). In this application, the input and output buffers 101 and 105, the sampling switch 102, and hold capacitor 103 operate in much the manner known in the art to sample and hold signals in advance of A-D conversion. Typically, sample and hold circuit arrangements like this are designed contemplating the voltage level shift necessarily imparted by the input buffer 101, as reflected in the signal $V_{IN}'$ at the buffer's output. This may be acceptable if not for the added voltage level shift to be incurred through the output buffer 105.

The level shift segment 12 provides the remedial level shift in voltage needed to ensure that when presented at the input of the output buffer 105, the sampled and held signal is of sufficient voltage level to afford the level shift incurred through buffer 105. In this manner, the undesired shift in signal voltage imposed by the input buffer 101 and/or the undesired voltage shift to be imposed by the output buffer 105 may be adequately accounted for.

The level shift segment 12 thus serves effectively to emulate an ideal battery which supplies a consistent bias to the signal voltage captured by the hold capacitor 103, for passage into the output buffer 105. The level shift segment 12 does so not only for the higher frequency signals, but also for lower frequency signals down to DC.

In the sample and hold circuit portions of system 10, the input buffer 101 may be formed with a source follower or any other known buffer circuit topology of suitable type. The output buffer 105 may likewise be formed with any such suitable buffer circuit topology known in the art. The sampling switch 102, which establishes a low resistance conductive path between the output terminal of buffer 101 and the hold capacitor 103 when activated, is preferably formed in the exemplary embodiment as a p-channel metal-oxide type semiconductor (PMOS) field effect transistor device. The sampling switch 102 may otherwise be formed with one or more devices of other types suitable for the given application. The hold capacitor 103 may be realized by one or more capacitive elements to charge while the sampling switch 102 is conducting, and hold the charged voltage at node N1 when the sampling switch 102 is turned off.

While a capacitive value of 1 pF is indicated in the figure for this hold capacitor 103, that value is purely exemplary and shown merely as a general indication of the capacitor's sizing relative to certain other capacitive elements employed in the system. Like the other quantitative values indicated in the figure, this capacitance value will depend upon the particular needs and requirements of the given application, and is shown for illustrative purposes only.

The level shift segment 12 includes a first circuit portion formed in the exemplary embodiment by a first capacitor unit 104, which stores the voltage by which to shift the higher frequency signals passed therethrough for input to the output buffer 105. The level shift segment 12 also includes a second circuit portion which serves the dual purposes of keeping the first capacitor unit 104 charged to a desired shift voltage and defining a bypass route for those signals with frequencies approaching DC which cannot be adequately pass through the first capacitive unit 104 due to its DC blocking effects.

The second circuit portion employs a switched capacitive section formed by a second capacitor unit 110 alternatively coupled for charging and transfer phases of operation by respective charging switches 108, 109 and respective transfer switches 106, 107. Preferably, the switched capacitive section also includes a cross-over resistor unit 111 connected as shown between transfer switch 107 and the node N4 defined between the first capacitive unit 104 and the input terminal of output buffer 105.

The level shift segment 12 thus establishes alternate paths for sampled and held signals to be level shifted and passed to the output buffer 105. A primary path P1 is established for those signals in the upper region of the given signal frequency range, from a certain cut-off frequency (frequency corner) up to at least the Nyquist frequency required for subsequent A-D conversion or other further sampling operation on the signal $V_{OUT}$ provided at the output of buffer 105. An alternate path P2 is established for those signals within a lower region of the applicable signal frequency range, from the cut-off frequency down to DC, so that those signals too may be passed with proper level shift on to the buffer 105 for further downstream processing.

The second capacitor unit 110 incorporated by the switched capacitive section is preferably, though not necessarily, much smaller in capacitance than the first capacitor unit 104. This is indicated by its illustrative capacitance value of 0.2 pF in contrast to the 4 pF illustratively shown for the first capacitor unit 104. Again, these illustrative values are suitably determined for each specific application according to the particular needs and requirements of that application, and indicated in FIG. 1 purely for illustrative purposes in connection with the particular sample and hold application shown.

During a charging phase of operation, the terminals of the second capacitor unit 110 are coupled to reference voltage nodes 127, 128 by activation of the respective charging switches 108, 109. During this time, the terminals of the second capacitor unit 110 are necessarily kept decoupled from the nodes N1, N4 by deactivation of the respective transfer switches 106, 107. First and second reference voltages REF 1 and REF 2 are respectively applied at the nodes 127, 128. These reference voltages REF 1, REF 2 may be established by any suitable means known in the art, such as by combining other voltage references and/or replica circuits.

The actual values of REF 1, REF 2 are set such that they are separated by the desired shift voltage. The desired voltage shift, hence the values of REF 1 and REF2, will depend on various factors, not the least of which are the topologies of the input and output buffers 101, 105. Preferably, the first reference voltage REF1 applied at node 127 is set to the common mode voltage level nominally expected at node N1 (that is, at the output of the sampling switch 102), while the second reference voltage REF2 at node 128 is preferably set to the common mode voltage desired at node N4 (that is, at the input of output buffer 105).

During the switched capacitive section's charging phase of operation, then, the second capacitor unit 110 is coupled between the nodes 127, 128, such that it charges to the difference voltage REF1–REF2 (the negative voltage denoting the required voltage polarity for the required level shift upward in magnitude). During a subsequent transfer phase of operation, the terminals of the second capacitor unit 110 are decoupled from the nodes 127, 128 by deactivation of the respective charging switches 108, 109 and alternatively coupled to the nodes N1, N4 by respective transfer switches 106, 107. Preferably, one of the terminals of the second capacitor unit 110 is actually coupled to the node N4 through a cut-off resistance unit 111. This permits the second capacitor unit 110 to restore in the first capacitor unit 104 the charge it may have lost in the meantime through any leakage effects or the like. The second capacitor unit 110 thus serves a charge replenishing function which preserves the ideal battery emulation of the first capacitor unit 104.

The resultant switching of the second capacitor unit 110 between its charging and transfer phases of operation concurrently serves to establish the alternate signal path P2 for the lower frequency signals. Signals of frequencies down to DC may then pass through P2, by-passing the first capacitive unit 104, for level shifted passage to the output buffer 105.

Any suitable combination of switching device types and configurations may be employed in the switched capacitive section of the level shift segment 12 depending on the particular needs and requirements of the given application. The same is true for the actual configuration and make up of the second capacitor unit 110. In the example shown, the transfer switches 108, 109 are preferably implemented as substantially identical PMOS devices both driven by the same clock signal PH2_n applied at their gate terminals. The transfer switch 107 is preferably formed as a PMOS device controlled by a different clock signal PH1_n applied at its gate terminal. The other transfer switch 106 may be similar to the transfer switch 107 and likewise controlled by the clock signal PH1_n. But in the embodiment shown, it is preferably formed as an NMOS device controlled at its gate by the same bootstrapped gate control signal PH1_bootstrap used for controlling the sampling switch 102.

The bootstrapped gate control signal PH1 bootstrap may be generated by any suitable means known in the art to track the input signal $V_{IN}$ when in its activating state, preferably as a level shifted version of $V_{IN}$ during such activating state. As described in following paragraphs in connection with FIG. 2a, use of this bootstrapped gate control signal (which, when in its activating state, tracks the voltage of the input signal $V_{IN}$), among other things, offers the advantage of a sufficiently high gate control voltage to ensure turn on of the controlled switch device. The high gate control voltage also ensures that the switch device's on resistance remains relatively constant during activation to help preserve linearity of the switch enabled process.

Although the bootstrapped signal PH1 bootstrap is not identical in timing to the clock signal PH1_n, it is close enough that its activation states largely coincide with those of the clock signal PH1_n. Like that clock signal PH1_n, therefore, the bootstrap signal PN1 bootstrap remains non-overlapping with respect to the clock signal PH2 n which controls the charging switches 108, 109. That is, the transfer switches 106, 107 on the one hand and the charging switches 108, 109 on the other hand are activated in mutually exclusive manner. Consequently, the second capacitor unit 110 is successively switched between a charging mode where it is charged to the shift voltage (REF1−REF2), and the transfer mode, where it is coupled to transfer charge to the first capacitor unit 104 as needed. The charge transfer occurs over a non-zero time period according to a charging time constant controlled by the resistance of the cross over unit 111 and the effective capacitance of the series-combined first and second capacitor units 110, 104.

As mentioned, the resultant switching operation of the switched capacitive section establishes the bypassing path P2 for those lower frequency signals down to DC which might otherwise be blocked by the first capacitive unit 104. This switching operation collectively provided for the second capacitor unit 110 by the charging and transfer switches 108, 109 and 106, 107 causes the switched capacitive section to appear to those lower frequency signals effectively as a lossless resistor, whose resistance value is determined in inverse relation to a product of the section's effective capacitance and switching frequency. With typical values of capacitance and switching frequency values employed for many applications, the frequency at which a signal would cross over from the switched capacitive section's high frequency signal path P1 to the low frequency signal path P2 would be set fairly high due to that inverse parametric relationship (between effective resistance and the product of effective capacitance and switching frequency). Incorporating the cross-over resistor unit 111 into the switched capacitive section raises its effective resistance. Due to the inverse parametric relationship between this effective resistance and the product of effective capacitance and switching frequency, the effective switching frequency is accordingly lowered. Incorporation of the resistor unit 111 thus has the effect of lowering the cross-over frequency (frequency corner) which delineates the low and high signal frequency domains.

The actual value of this cross-over frequency may be adjusted by controlling the resistance value of the cross-over resistor unit 111. This is set in the example shown to an illustrative value of 200 kΩ. Obviously, this value is purely illustrative, and the actual value employed will depend on the other parametric values employed and the particular needs and requirements of the intended application. A practical limit for this cross-over resistance value, however, may be set by such factors as the parasitic capacitance associated with the cross-over resistor unit 111 itself.

With the switched capacitive section operating in this manner, signals across the full frequency range of interest, from DC on up to and beyond the applicable Nyquist frequency, may be adequately level shifted and passed for output through the buffer 105. Input signals in the high frequency domain above the prevailing cutoff frequency will pass along signal path P1, being level shifted by the stored shift voltage of the first capacitor unit 104. At these high frequencies, the resistor unit 111 helps to isolate the second capacitor unit 110 from the signal's frequency response, and the first capacitor unit 104 serves much like an ideal battery.

Alternatively, signals having a frequency at or below the cross-over frequency (or below the cutoff frequency only, depending on how that cutoff frequency is defined) traverse the second signal path P2 established by the switched capacitive section's switching operation for level shifted passage to the output buffer 105. The switched capacitor section thus controls the frequency response for these low frequency signals down to DC.

Figure 2A:
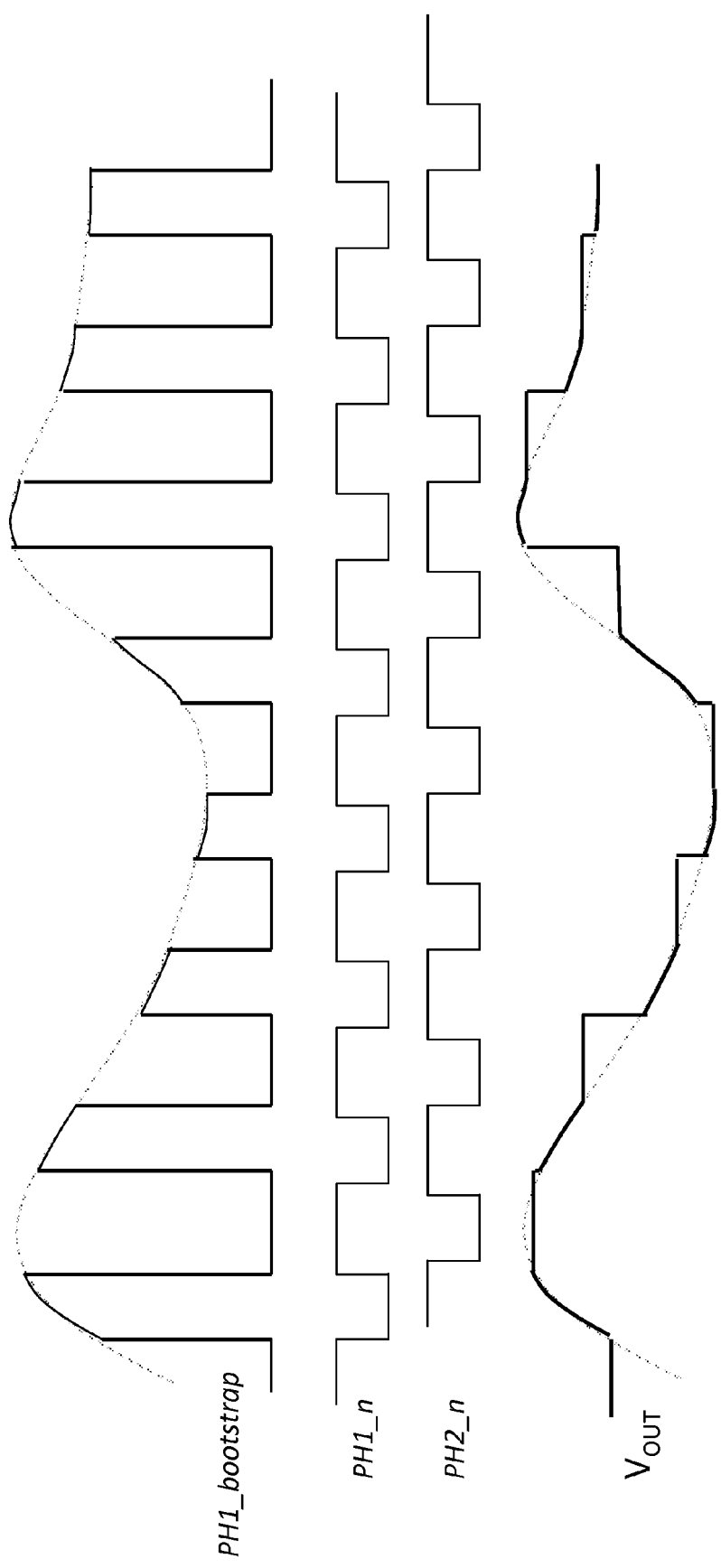
FIG. 2a is a set of waveform diagrams showing illustrative voltage levels of various signals employed in the embodiment of FIG. 1.
Figure 2B:
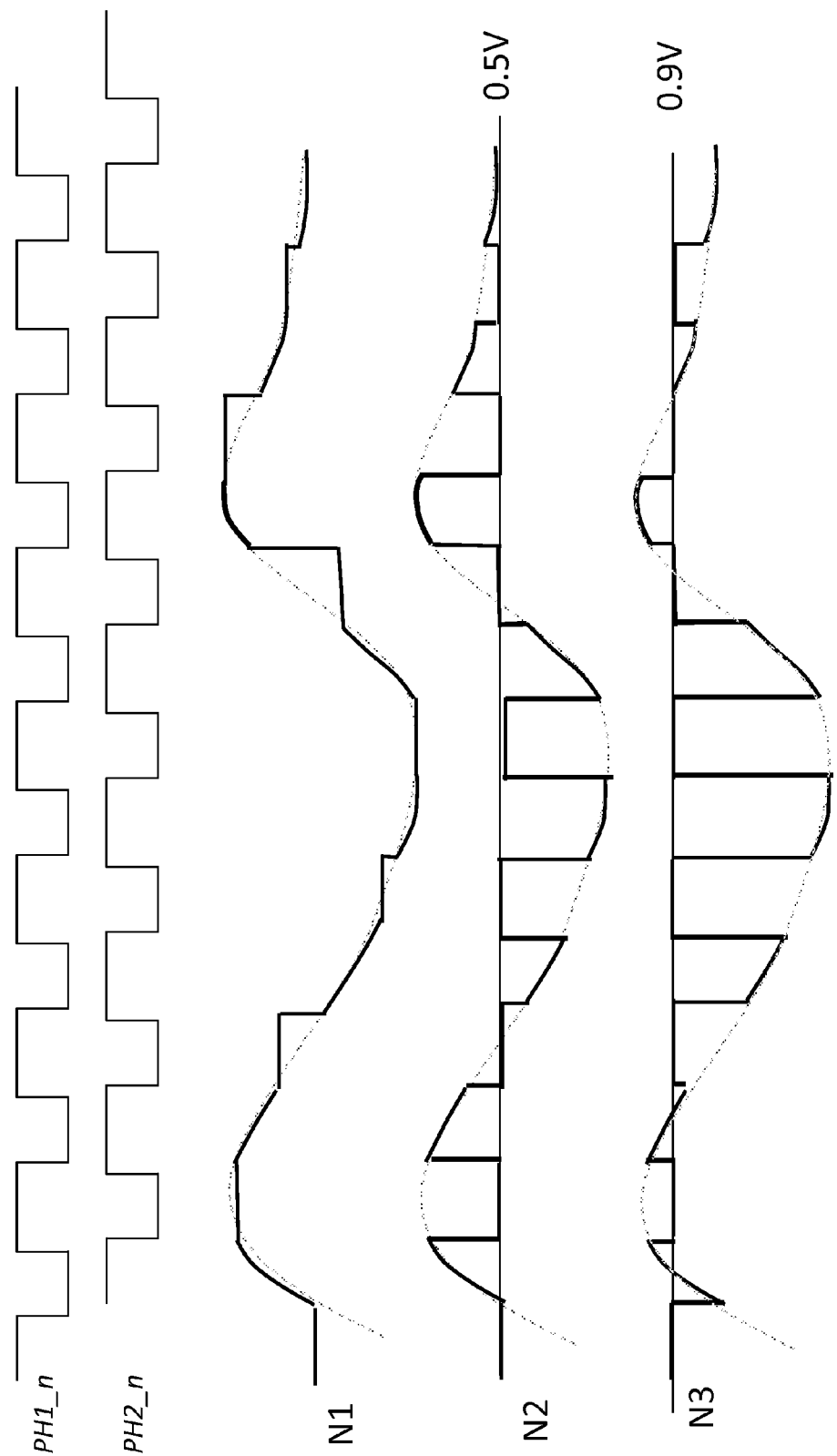
FIG. 2b is another set of waveform diagrams showing illustrative voltage levels of various signals employed in the embodiment of FIG. 1.

Turning to FIGS. 2a-2b, waveforms are illustrated for various signals during operation of system 10. As noted in preceding paragraphs, system 10 in the example illustrated operates on one component $V_{IN}$ of a differential signal, and the first and second reference voltages REF 1, REF2 are set to the differential signal's common mode voltage nominally expected and desired respectively at the nodes N1, N4.

The sampling switch is controlled by the bootstrapped gate control signal PH1_bootstrap. For illustrative purposes, the waveform representation of this signal is shown superimposed over a broken line waveform representing a level shifted version of $V_{IN}$. When this sampling signal is at 0V, the NMOS sampling switch 102 is deactivated to its open state. When the signal rises to its bootstrapped voltage (or to the input voltage at that time), the sampling switch 102 is activated to its on, or sampling, state. The bootstrap voltage provides a sufficiently high voltage to ensure that the sampling switch 102 is turned on at the appropriate times. The high bootstrap voltage also serves to maintain a relatively constant on resistance of the sampling switch 102 during sampling, to improve linearity of the sampling process.

Use of this bootstrapped signal for gate control of transfer switch 106 of the switched capacitive section serves to improve low frequency distortion by keeping the on resistance of NMOS switch 106 low and relatively constant during activation. Preferably, the transistor size of switch 106 is such that the voltage on its drain closely follows the voltage on the hold capacitor 103.

The signals PH1_n and PH2_n are inverted non-overlapping clocks. Consequently, these clocks are never low at the same time. When PH2_n is low, charging switches 108 and 109 of the switched capacitive section are activated to interconnect the two terminals of the second capacitor unit 110 to REF1 and REF2. These two switches are necessarily opened during the transfer phase of the switched capacitive section, when the transfer switches 106 and 107 are closed. If the voltage across the first capacitor unit 104 is not equal to the voltage across the second capacitor unit 110, the deficient charge is transferred from the second capacitor unit 110 to the first capacitor unit 104. The amount of charge transferred in one clock cycle is limited by the cross-over resistor unit 111 which determines the transition point in frequency between the low and high frequency regions of the signal frequency range.

The output signal $V_{OUT}$ waveform reflects the sampled and held waveform seen at the hold capacitor 103. For illustrative purposes, the waveform representation of signal $V_{OUT}$ is shown in this case superimposed over a broken line waveform representing signal $V_{IN}'$ provided at the output of input buffer 101, or at node N1. The waveforms at the nodes N1, N2, N3 illustrated in FIG. 2b are similarly shown superimposed over the broken line waveform for $V_{IN}'$.

As shown, the output signal $V_{OUT}$ tracks the signal $V_{IN}'$ in voltage. This reflects the restorative voltage level shift provided by system 10 to suitably account for the undesired voltage level shift incurred through output buffer 105.

Use of the switched capacitive section in the disclosed manner enables the level shift segment 12 to effect level shifting while drawing minimal power and maintaining high linearity. Still, the disparate paths P1, P2 for signals in different frequency regions exposes system 10 to correspondingly disparate attenuation effects due to different total parasitic capacitance encountered in the signal paths. The actual attenuation due to parasitic capacitance tends to be sufficiently low to remain tolerable if uniformly encountered by signals across the entire range of signal frequencies. It is often the disparity in attenuation for signals in different regions of the frequency range that proves problematic.

With careful design and fabrication, it may be possible to physically implement system 10 on monolithic chips or the like with little, if any difference in capacitive attenuation encountered in the signal paths P1, P2. This would be nearly impossible to consistently replicate, if for no other reason than random PVT (process, voltage, and temperature) variations. Consequently, it is difficult to realize a fixed physical implementation where the capacitive attenuation in the high and low frequency paths P1, P2 are sufficiently matched to yield a flat frequency response for the entire signal frequency range from DC up through the applicable Nyquist frequency. Nor is it feasible to configure system 10 to yield a consistent frequency response over the full range of signal frequencies, regardless of the desired response profile.

Accordingly, a selectively controllable attenuation adjust unit is coupled to at least one of the path-defining circuit portions of the level shift segment 12. In the embodiment shown, first and second attenuation adjust units 112, 113 are preferably coupled to the level shift segment 12 at respective nodes N3 and N4. Each of the attenuation adjust units 112, 113 is preferably formed as an array of parallel trim capacitors 114, 115, 116 and 120, 121, 122 which may be selectively tied in to the respective circuit portions of the level shift segment 12 by digitally enabling them via corresponding switches 117, 118, 119, and 123, 124, 125. A multi-bit programmable word may be applied to independently control each attenuation adjust unit 112, 113 in this regard.

Turning to each individual signal path P1, P2, the sources of parasitic capacitance affecting each are different. In the high signal frequency path P1, the signal encounters a capacitance divider resulting from the combination of the first capacitor unit 104 and the total parasitic capacitance seen at the input of the output buffer 105, or at the net 129. Contributors to this parasitic capacitance include metal interconnect parasitics, the capacitor parasitics of the first capacitor unit 104 itself, and the input capacitance of the output buffer 105. Although the first capacitor unit 104 is made relatively large to minimize attenuation effects and alleviate sensitivity to parasitic capacitance on the net, a constant attenuation invariably results from the capacitance divider encountered in this path. For example, capacitive attenuation on the order of about 5% would not be atypical.

In the low frequency path P2, where signal frequencies approach DC, the signal encounters a capacitance divider resulting from the second capacitor unit 110 and the parasitic capacitance seen at net 130. Some level of capacitive attenuation is invariably encountered as a result.

As mentioned, a flat frequency response is particularly necessary for certain types of processing. One notable example is in QAM (quadrature amplitude modulation) processing in which data is represented using I (in-phase) and Q (in quadrature) carrier signals to effectively increase bandwidth. When processed, the data is spread out in different frequency bands from DC out to Nyquist for accurate extraction. While this process can tolerate some ripple in the frequency response, it tends to require a consistent, flat response across the entire frequency range from DC to the Nyquist frequency and beyond. That is, for proper operation, such processes require equal attenuation for both low and high frequency signals passed by system 10.

The attenuation adjust units 112 and 113 provide controllable measures for independently adjusting—to fine tune—the capacitive attenuation in each of the signal paths P2, P1 toward that end. The switches 117, 118, 119, and 123, 124, 125 may be digitally controlled (using one or more programmable multi-bit calibration/control words) to selectively connect the different trim capacitors 114, 115, 116 and 121, 122, to the nets 130 and 129. Thus, the attenuation adjust unit 112 may 'switch in' as needed additional capacitance in parallel to the parasitic capacitance seen on net 130. This would increase the low frequency capacitive attenuation encountered through the low frequency path P2. Similarly, the attenuation adjust unit 113 may 'switch in' additional capacitance in parallel to the parasitic capacitance seen on net 129. This would increase the high frequency capacitive attenuation encountered in the high frequency signal path P1. Thus, even if system 10 were designed with an eye towards balancing the low and high frequency signal path attenuations, such digital calibration measures offer a convenient safeguard against PVT variations that may otherwise disrupt gain flatness across the signal frequency range in question.

Figure 3:
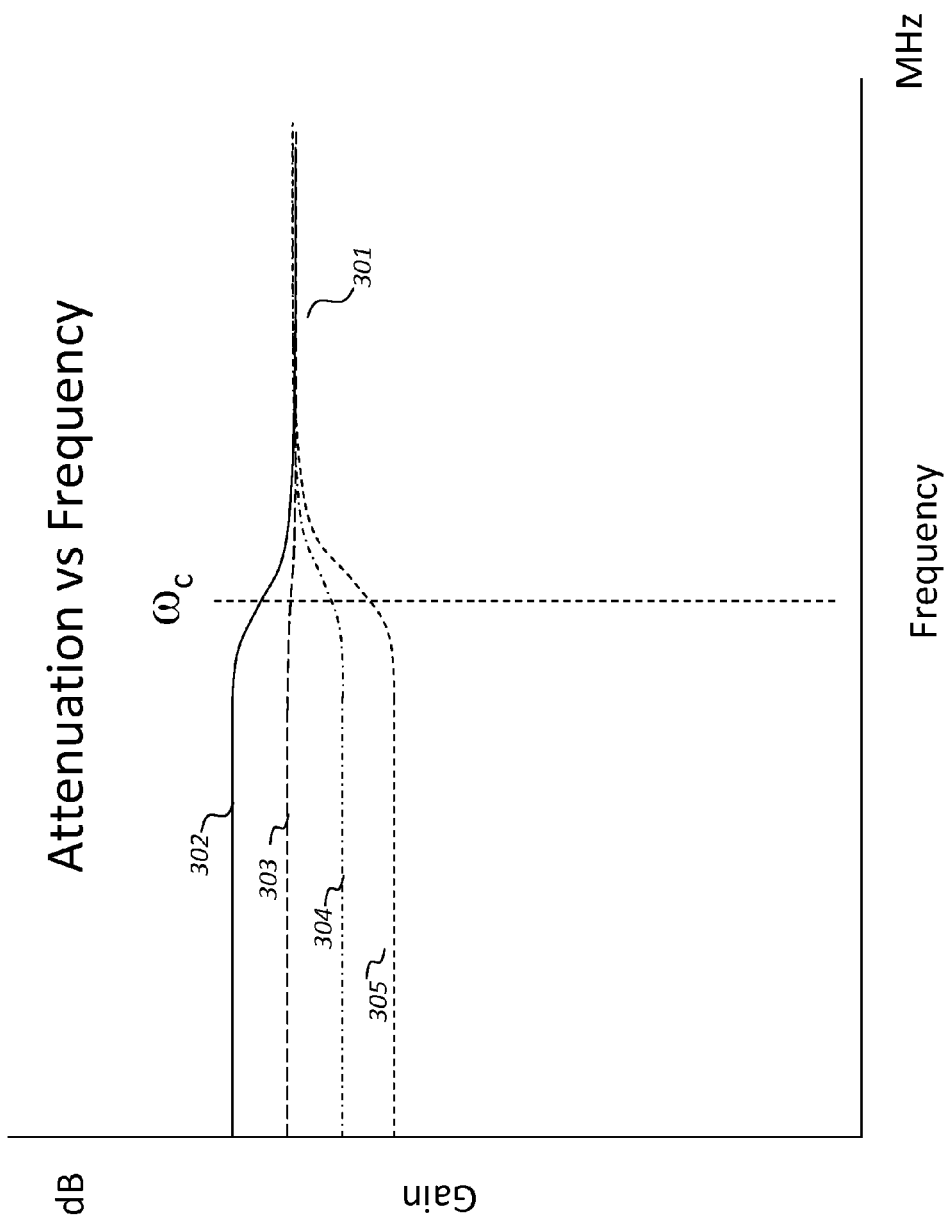
FIG. 3 is a diagram comparatively showing illustrative effects of attenuation adjustment on a certain portion of a frequency response for the embodiment of FIG. 1; and, FIG. 4 is a diagram comparatively showing illustrative effects of attenuation adjustment on a certain other portion of a frequency response for the embodiment of FIG. 1.
Figure 4:
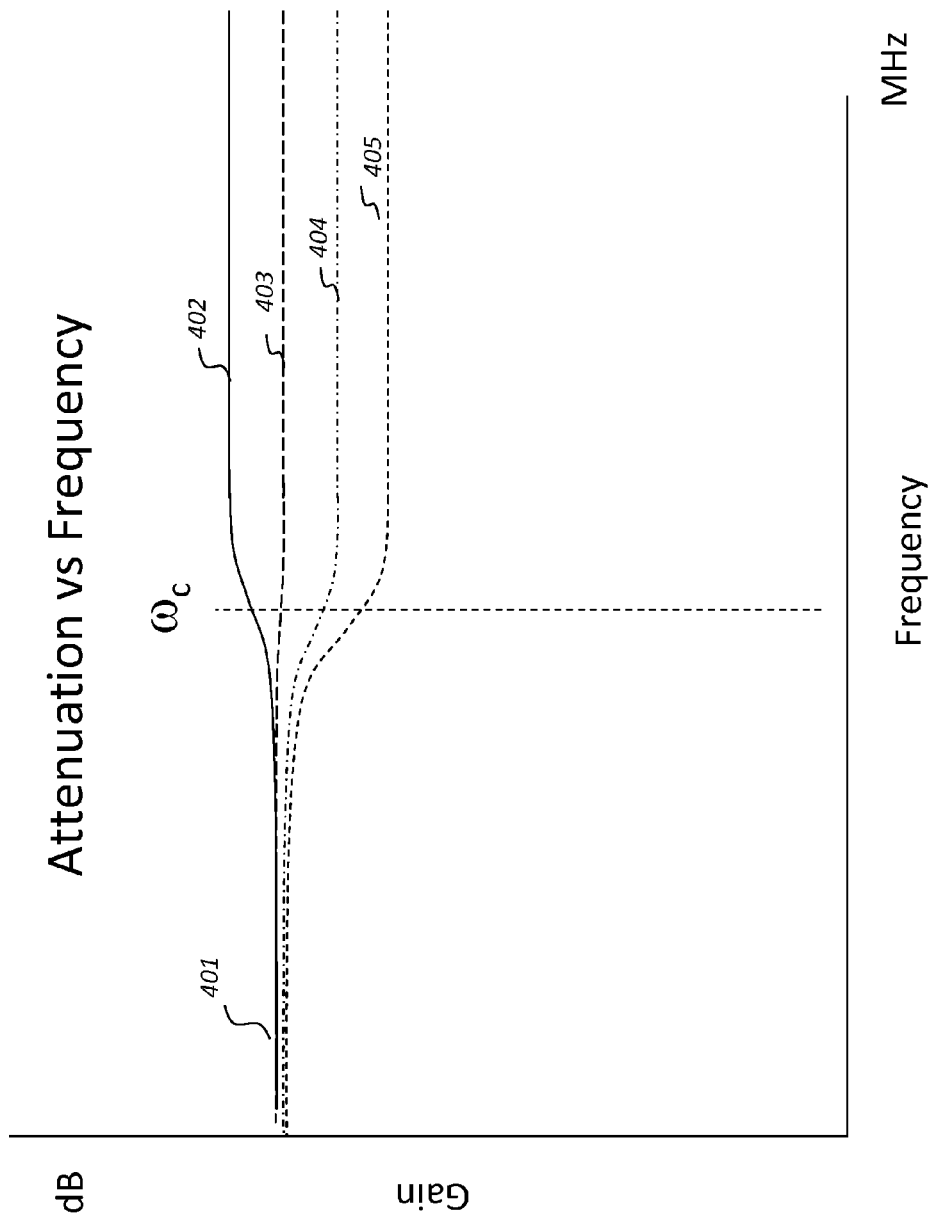

This is illustrated in FIGS. 3 and 4. FIG. 3 illustrates the case where the gain of system 10 observed for signals within the lower region of the signal frequency range (or below a certain cutoff frequency w) indicated by the curve portion 302 is greater than the gain observed for signals in the upper region of the frequency range indicated by the curve portion 301, with no adjustment provided by the units 112, 113. Curve portions 303, 304, 305 illustrate the gain observed for system 10 with the low frequency attenuation adjust unit 112 digitally controlled to enable successively increasing numbers of its trim capacitors 114, 115, 116. Enabling more of the trim capacitors 114-116 incrementally augments the attenuation so that the gain is accordingly lowered. In this example, the configuration of attenuation adjust unit 112 corresponding to the curve portion 303 would be selected so as to flatten out the gain response curve across the full signal frequency range.

FIG. 4 illustrates the case where the gain of system 10 observed for signals within the upper region of the signal frequency range (or above a certain cutoff frequency w) indicated by the curve portion 402 is greater than the gain observed for signals in the lower region of the frequency range indicated by the curve portion 401, with no adjustment provided by the units 112, 113. Curve portions 403, 404, 405 illustrate the gain observed for system 10 with the high frequency attenuation adjust unit 113 digitally controlled to enable successively increasing numbers of its trim capacitors 120, 121, 122. Enabling more of the trim capacitors 120-122 incrementally augments the attenuation so that the gain is accordingly lowered. In this example, a configuration of attenuation adjust unit 113 corresponding to the curve portion 403 would be selected so as to flatten out the gain response curve across the full signal frequency range.

As FIGS. 3-4 illustrate, system 10 may be adjustably controlled to provide level shifting of a signal's common mode voltage in a sample and hold circuit with extremely low power consumption and very low distortion. The digital adjustment capability provided by system 10 enables fine tuning/calibration of its gain flatness, making the system particularly useful for those applications requiring consistent frequency response with low distortion for the full input bandwidth all the way down to DC. The digital adjustment capability provided by system 10 thereby bridges the possible gap between the system's simulated and actual operations, which not only eases implementation tolerances, but also permits a degree of flexibility to vary the system's frequency response for different applications than may have been originally intended.

These and other features render system 10 highly effective as a low power, high speed sample and hold circuit for advanced A-D converters used, for instance, in deep submicron processes with heightened requirements for low power consumption and sensitivity to distortion. The system's precise adjustability of capacitive attenuation with very fine resolution makes it particularly effective for those applications where accurate IQ processing is required for analog signals having frequencies ranging down to DC.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular applications of elements may be reversed or interposed, all without departing from the spirit or scope of the invention as defined in the appended claims.

What is claimed is:

1. A system for level shifting signals provided by an electronic circuit with selectively controlled frequency response, comprising:
    a first circuit portion defining a primary path for an intermediate signal generated by the electronic circuit within an upper region of a predefined signal frequency range, said first circuit portion including a first capacitor unit establishing a voltage level shift for the intermediate signal when passed through said primary path;
    a second circuit portion selectively defining a secondary path bypassing said primary path for an intermediate signal generated by the electronic circuit within a lower region of the predefined signal frequency range, said second circuit portion establishing a voltage level shift for the intermediate signal when passed through said secondary path, said second circuit portion including a switched capacitive section disposed in parallel across said first capacitor unit and selectively actuated in mutually exclusive charging and transfer phases, said switched capacitive section having a second capacitor unit charged substantially to a predetermined shift voltage in said charging phase and coupled to said first capacitor unit during said transfer phase; and,
    at least one attenuation adjust unit coupled to one of said first or second circuit portions, said attenuation adjust unit being selectively configured in capacitance for adjustably augmenting a parasitic capacitance of said first or second circuit portion;
    wherein said switched capacitive section includes a crossover unit coupled to said second capacitor unit and activated based on a predetermined switching frequency to establish a cross-over frequency delineating said upper and lower regions of the signal frequency range.

2. The system as recited in claim 1, wherein said switched capacitive section further includes:
    a pair of charging switches selectively coupling said second capacitor unit across a pair of reference voltage sources in said charging phase for charging said second capacitor unit substantially to a predetermined shift voltage; and,
    a pair of transfer switches selectively coupling said second capacitor unit to charge said first capacitor unit in said transfer phase.

3. The system as recited in claim 2, comprising a plurality of said attenuation adjust units respectively coupled to said first and second circuit portions, said attenuation adjust units being selectively adjustable to maintain a substantially flat frequency response for the system over said predefined signal frequency range.

4. The system as recited in claim 3, wherein each said attenuation adjust unit includes a programmably enabled array of trim capacitors disposed in parallel one relative to the other.

5. The system as recited in claim 2, wherein said charging and transfer switches are activated responsive to periodic respective signals, said charging switches being thereby activated in mutually exclusive relation to said transfer switches.

6. The system as recited in claim 5, wherein the electronic circuit includes a sample and hold circuit periodically sampling an input signal according to a bootstrap signal to generate the intermediate signal, the bootstrap signal periodically tracking the input signal.

7. The system as recited in claim 6, wherein said first and second circuit portions are disposed between a hold capacitor and output buffer of the sample and hold circuit.

8. The system as recited in claim 7, wherein said charging switches are activated responsive to a clock signal, and at least one of said transfer switches is activated responsive to the bootstrap signal.

9. The system as recited in claim 8, wherein the input signal is one of the complementarily paired components of a differential signal, said voltage level shift representing a common mode voltage shift for the differential signal.

10. The system as recited in claim 2, wherein said crossover unit includes a resistor coupled in series with said second capacitor unit, said cross-over unit activating responsive to periodic activation of said transfer switches according to said predetermined switching frequency, the cross-over frequency being established responsive to values of said resistor and predetermined switching frequency.

11. The system as recited in claim 10, wherein the electronic circuit includes a sample and hold circuit periodically sampling an input signal to generate the intermediate signal; and, wherein said lower region of the predefined signal frequency range extends from said cross-over frequency down to substantially DC, and said upper region of the predefined signal frequency range extends from said cross-over frequency up to at least a preselected Nyquist rate.

12. A sample and hold system with level shifting having selectively controlled frequency response, comprising:
 a hold capacitor periodically switched according to a bootstrap signal to hold a sampled part of an input signal, the bootstrap signal periodically aligning in amplitude with a level shifted version of the input signal;
 an output buffer;
 a first circuit portion coupled to define a high frequency path between said hold capacitor and output buffer for an intermediate signal generated upon charging of said hold capacitor within an upper region of a predefined signal frequency range, said first circuit portion including a first capacitor unit establishing a voltage level shift for the intermediate signal when passed through said primary path;
 a second circuit portion selectively defining a low frequency path bypassing said primary path for an intermediate signal generated upon charging of said hold capacitor within a lower region of the predefined signal frequency range, said second circuit portion establishing a voltage level shift for the intermediate signal when passed through said secondary path, said second circuit portion including a switched capacitive section disposed in parallel across said first capacitor unit and selectively actuated in mutually exclusive charging and transfer phases, said switched capacitive section having a second capacitor unit charged substantially to a predetermined shift voltage in said charging phase and coupled to said first capacitor unit during said transfer phase; and,
 at least one attenuation adjust unit coupled to one of said first or second circuit portions, said attenuation adjust unit being selectively configured in capacitance for adjustably augmenting a parasitic capacitance of said first or second circuit portion:
 wherein said switched capacitive section includes a cross-over unit coupled to said second capacitor unit and activated based on a predetermined switching frequency to establish a cross-over frequency delineating said upper and lower regions of the signal frequency range.

13. The system as recited in claim 12, wherein said cross-over unit includes a resistor coupled in series with said second capacitor unit, said cross-over unit activating responsive to a predetermined switching frequency, the cross-over frequency being established responsive to values of said resistor and predetermined switching frequency.

14. The system as recited in claim 13, wherein said lower region of the predefined signal frequency range extends from said cross-over frequency down to substantially DC, and said upper region of the predefined signal frequency range extends from said cross-over frequency up to at least a preselected Nyquist rate.

15. The system as recited in claim 14, comprising a plurality of said attenuation adjust units respectively coupled to said first and second circuit portions; each said attenuation adjust unit including a programmably enabled array of trim capacitors disposed in parallel one relative to the other; said attenuation adjust units being selectively adjustable to maintain a substantially flat frequency response for the system over said predefined signal frequency range.

16. The system as recited in claim 15, wherein said switched capacitive section further includes:
 a pair of charging switches selectively coupling said second capacitor unit across a pair of reference voltage sources in said charging phase for charging said second capacitor unit substantially to a predetermined shift voltage; and,
 a pair of transfer switches selectively coupling said second capacitor unit to charge said first capacitor unit in said transfer phase.

17. The system as recited in claim 16, wherein said charging switches are activated responsive to a clock signal, and at least one of said transfer switches is activated responsive to the bootstrap signal.

18. A method for level shifting signals provided by an electronic circuit with selectively controlled frequency response, comprising:
 establishing a first circuit portion to define a high frequency path for an intermediate signal generated by the electronic circuit within an upper region of a predefined signal frequency range, charging a first capacitor unit in said first circuit portion to a apply a voltage level shift to the intermediate signal when passed through said high frequency path;
 selectively establishing a second circuit portion to define a low frequency path bypassing said primary path for an intermediate signal generated by the electronic circuit within a lower region of the predefined signal frequency range, actuating said second circuit portion to apply a voltage level shift to the intermediate signal when passed through said low frequency path;
 selectively actuating a switched capacitive section in said second circuit portion in mutually exclusive charging and transfer phases, charging a second capacitor unit in said switched capacitive section substantially to a predetermined shift voltage in said charging phase, and coupling said second capacitor unit to said first capacitor unit during said transfer phase; and,
 establishing at least one attenuation adjust unit coupled to one of said first or second circuit portions, and selectively configuring said attenuation adjust unit in capacitance to adjustably augment a parasitic capacitance of said first or second circuit portion;
 wherein said switched capacitive section includes a cross-over unit coupled to said second capacitor unit and activated based on a predetermined switching frequency to establish a cross-over frequency delineating said upper and lower regions of the signal frequency range.

19. The method as recited in claim 18, wherein a plurality of said attenuation adjust units are established respectively coupled to said first and second circuit portions, each said attenuation adjust unit including an array of trim capacitors disposed in parallel one relative to the other; programmably enabling said trim capacitors of said attenuation adjust units to maintain a substantially flat frequency response when the intermediate signal is voltage level shifted and passed through an output buffer.

20. The method as recited in claim 19, wherein a pair of charging switches are selectively activated to periodically couple said second capacitor unit of said switched capacitive section across a pair of reference voltage sources during said charging phase for incrementally charging said second capacitor unit substantially to a predetermined shift voltage; and, a pair of transfer switches are selectively activated to periodically couple said second capacitor unit to charge said first capacitor unit during said transfer phase.

21. The method as recited in claim 20, wherein said charging and transfer switches are activated responsive to respective periodic signals, said charging switches being thereby activated in mutually exclusive relation to said transfer switches.

22. The method as recited in claim 21, wherein an input signal is periodically sampled and held in a hold capacitor according to a bootstrap signal, the bootstrap signal periodically aligning in amplitude with a level shifted version of the input signal, said hold capacitor being discharged to generate the intermediate signal.

23. The method as recited in claim 22, wherein said charging switches are activated responsive to a clock signal, and at least one of said transfer switches is activated responsive to the bootstrap signal.

24. The method as recited in claim 19, wherein the input signal is one of the complementarily paired components of a differential signal, said voltage level shift representing a common mode voltage shift for the differential signal.

25. The method as recited in claim 20, wherein said cross-over unit includes a resistor coupled in series with said second capacitor unit in said switched capacitive section, said cross-over unit activating responsive to periodic activation of said transfer switches according to a predetermined switching frequency, the cross-over frequency being established responsive to values of said resistor and predetermined switching frequency.

\* \* \* \* \*